(12) United States Patent
Coglitore

(10) Patent No.: US 10,586,607 B2
(45) Date of Patent: Mar. 10, 2020

(54) METHOD AND APPARATUS FOR IMPLEMENTING DISAGGREGATED MEMORY PLATTERS

(71) Applicant: R-STOR INC., Saratoga, CA (US)

(72) Inventor: Giovanni Coglitore, Saratoga, CA (US)

(73) Assignee: R-STOR INC., Saratoga, CA (US)

( * ) Notice: Subject to any disclaimer, the term of this patent is extended or adjusted under 35 U.S.C. 154(b) by 117 days.

(21) Appl. No.: 15/654,183

(22) Filed: Jul. 19, 2017

(65) Prior Publication Data

US 2018/0025786 A1 Jan. 25, 2018

Related U.S. Application Data

(60) Provisional application No. 62/364,075, filed on Jul. 19, 2016.

(51) Int. Cl.
| | |
|---|---|
| *G06F 11/00* | (2006.01) |
| *G11C 29/04* | (2006.01) |
| *G06F 11/14* | (2006.01) |
| *G06F 11/07* | (2006.01) |

(52) U.S. Cl.
CPC ............. *G11C 29/04* (2013.01); *G06F 11/00* (2013.01); *G06F 11/0727* (2013.01); *G06F 11/1458* (2013.01)

(58) Field of Classification Search
CPC ......................... G06F 11/0727; G06F 11/1458
See application file for complete search history.

(56) References Cited

U.S. PATENT DOCUMENTS

| | | | | |
|---|---|---|---|---|
| 6,018,512 A | * | 1/2000 | Belser | G11B 7/24 369/281 |
| 6,546,499 B1 | | 4/2003 | Challener et al. | |
| 7,774,315 B1 | * | 8/2010 | Galker | G06F 11/1464 707/644 |
| 9,001,451 B1 | * | 4/2015 | Martin | G11B 5/6029 360/75 |
| 9,384,093 B1 | * | 7/2016 | Aiello | G06F 3/0688 |
| 2006/0107131 A1 | * | 5/2006 | Mills | G06F 11/1076 714/710 |
| 2007/0294598 A1 | | 12/2007 | Anderson et al. | |
| 2009/0257142 A1 | * | 10/2009 | Sevvom | G11B 5/455 360/31 |
| 2012/0047340 A1 | * | 2/2012 | Inaba | G06F 11/2069 711/162 |
| 2014/0002922 A1 | | 1/2014 | Bandic et al. | |
| 2015/0277791 A1 | * | 10/2015 | Li | G06F 3/0689 711/114 |

OTHER PUBLICATIONS

International Preliminary Report on Patentability dated Jan. 31, 2019 corresponding to International Patent Application No. PCT/US2017/042816.

* cited by examiner

*Primary Examiner* — Katherine Lin
(74) *Attorney, Agent, or Firm* — Squire Patton Boggs (US) LLP

(57) ABSTRACT

A method and apparatus may include determining a failure of a drive. The drive comprises a plurality of platters, each platter comprises two half-platters, and data of the drive is stored via erasure encoding. The method can also include rebuilding a portion of the drive upon which the failure occurred, wherein other portions of the drive are not rebuilt.

12 Claims, 3 Drawing Sheets

Determining a failure of a drive — 110

Rebuilding a portion of the drive — 120

METHOD AND APPARATUS FOR IMPLEMENTING DISAGGREGATED MEMORY PLATTERS

CROSS REFERENCE TO RELATED APPLICATION

This application claims priority to U.S. Provisional Application No. 62/364,075 filed on Jul. 19, 2016. The entire contents of the above-referenced provisional application in hereby incorporated by reference.

BACKGROUND

Field

Certain embodiments of the present invention may relate to implementing disaggregated memory platters.

Description of the Related Art

Digital information has been traditionally stored on hard disk drives. Hard disk drives may store digital information using at least one rotating disk that includes magnetic material. The digital information may be written onto and read from the at least one rotating disk by a magnetic head. Because traditional hard disk drives typically use moving/mechanical components, these traditional hard disks would be prone to mechanical failure after extended use.

SUMMARY

According to first embodiment, a method can include determining a failure of a drive. The drive comprises a plurality of platters, each platter includes two half-platters, and data of the drive is stored via erasure encoding. The method can also include rebuilding a portion of the drive upon which the failure occurred. Other portions of the drive are not rebuilt.

In the method of the first embodiment, rebuilding a portion of the drive includes rebuilding a single platter of the drive.

In the method of the first embodiment, rebuilding a portion of the drive includes rebuilding a single half-platter of the drive.

In the method of the first embodiment, the platters or half-platters of the drive are separately addressable.

In the method of the first embodiment, the method can also include deactivating a single head that corresponds to the portion of the drive upon which the problem occurred.

In the method of the first embodiment, rebuilding the portion of the drive includes rebuilding the portion on a single new platter or a single new half-platter.

According to a second embodiment, an apparatus can include at least one processor. The apparatus can also include at least one memory including computer program code. The at least one memory and the computer program code can be configured, with the at least one processor, to cause the apparatus at least to determine a failure of a drive. The drive includes a plurality of platters, each platter includes two half-platters, and data of the drive is stored via erasure encoding. The apparatus can also be caused to rebuild a portion of the drive upon which the failure occurred, wherein other portions of the drive are not rebuilt.

In the apparatus of the second embodiment, rebuilding a portion of the drive comprises rebuilding a single platter of the drive.

In the apparatus of the second embodiment, rebuilding a portion of the drive includes rebuilding a single half-platter of the drive.

In the apparatus of the second embodiment, the platters or half-platters of the drive are separately addressable.

In the apparatus of the second embodiment, the apparatus is further caused to deactivate a single head that corresponds to the portion of the drive upon which the problem occurred.

In the apparatus of the second embodiment, rebuilding the portion of the drive includes rebuilding the portion on a single new platter or a single new half-platter.

According to a third embodiment, a computer program product can be embodied on a non-transitory computer readable medium, the computer program product configured to control a processor to perform a method according to the first embodiment.

BRIEF DESCRIPTION OF THE DRAWINGS

For proper understanding of the invention, reference should be made to the accompanying drawings, wherein.

DETAILED DESCRIPTION

Figure 1:
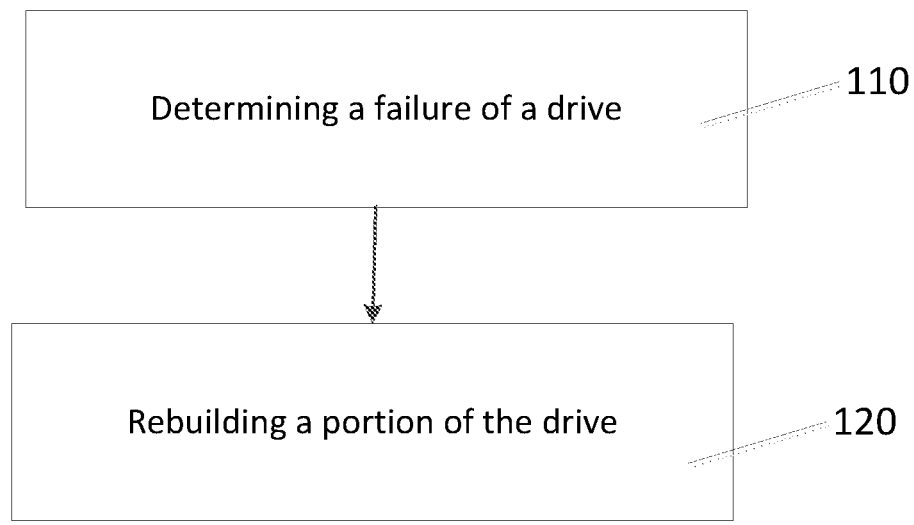
FIG. 1 illustrates a flowchart of a method in accordance with certain embodiments of the invention.

Certain embodiments are directed to disaggregated platters, disaggregated half-platters, and/or disaggregated spindles of memory devices. In general, the memory capacity of hard drives within a given physical geometry continues to increase as time passes. Although the memory capacity of hard drives of a given physical geometry has continually increased, year after year, further increases in capacity have been harder to achieve because the physical limitations of the drives are being approached. Further, as the capacities have increased, the drives have become less reliable. Each hard drive may include a plurality of corresponding platters, spindles, heads, and actuators. Each platter can include two halves (or two corresponding half-platters).

In recent times, the use of erasure encoding has become pervasive. With erasure encoding, a portion of stored data is split up into small portions of information (shards) and spread across multiple hard drives. Therefore, at any given time, erasure encoding stores copies of stored data across multiple hard drives. When the stored data is retrieved, the data may be retrieved from a variety of different sources.

With the current approaches of using erasure encoding, if a drive experiences failure, the data on the failed drive is retrieved from a plurality of different drives and rebuilt/restored onto a new drive. Specifically, the data stored on every platter of the failed drive will need to be rebuilt/restored onto a new drive. With the current approaches, any single problem which occurs within a drive (whether the problem is with a single actuator, single spindle, and/or single platter) will necessitate rebuilding the entire drive onto a new drive. This approach of rebuilding entire drives works effectively if the capacity of the drives is between 0.5 and 2 terabytes (TB). However, if the capacity of the failed drive is significantly larger than 2 terabytes, then the current approach of rebuilding the entire drive becomes ineffective.

The rebuilding of entire drives has become ineffective because, as the capacity of the drives has increased, the amount of time that is required to rebuild such entire drives has also increased. For example, in order to rebuild a drive with a capacity of 14 terabytes, the time required for rebuilding can be 4.5 days. While the lengthy rebuilding process is taking place, if additional failures occur, data may be lost. Therefore, the current approaches generally respond by sharding data across more and more drives to avoid the loss of data.

Each drive usually comprised one or two platters for storing data. However, current drives stack far more platters within a same physical geometry. For example, future drives may include 12 platters. Currently, drives may include up to 7 platters.

Certain embodiments are directed to reconfiguring the logical aspect of the platters of drives, where each platter can be recognized as a logical drive. Specifically, with certain embodiments, each platter can be configured and a recognized as a distinct memory volume. For example, each platter can be separately addressable (i.e., have a distinct address by which to be identified) by a processor or microcontroller. Therefore, while the previous approaches only recognized each complete drive as a distinct memory volume, certain embodiments of the present invention recognize each platter as a distinct memory volume. In other words, with certain embodiments, each platter can be considered to be a separate/distinct drive. Further, certain embodiments may consider each half-platter as a separate/distinct drive. As such, each half-platter may also be recognized as a logical drive.

By considering each platter or half-platter as a distinct logical drive, certain embodiments allow the rebuilding/restoring process to be a more manageable process because restoring data of a single platter (as opposed to restoring an entire drive) involves less data to be restored. Further, rebuilding/restoring a half-platter is also far more manageable because restoring data of a half-platter (as opposed to data of an entire drive) involves less data to be restored.

As opposed to having a capacity of a full drive (i.e., 14 TB), a platter generally has a capacity of about 2 TB. As described above, each platter comprises two half-platters (an A-side and B-side). Each platter generally has a corresponding first head atop the platter, and a second head on the bottom of the platter. As such, an example 5-platter drive has 10 individual surfaces.

In general, drive failures resulting from head crashes represent only a small amount of the overall drive failures. In most cases, the problems within a drive are unidentifiable. In general, if a failed drive has unidentified problems, the contents of the failed drive are first completely erased, and then the failed drive is generally reinserted into the system.

Certain embodiments may effect an improvement in the reliability paradigm. For example, in the event that a failure occurs on one side (a half-platter) of a platter, certain embodiments can be configured to deactivate the corresponding head of the failed half-platter. Alternatively, certain embodiments may be configured to deactivate the corresponding two heads (the top head and the bottom head) of the entire platter upon which the failure occurred. As such, certain embodiments of the present invention may consider a half-platter or a full-platter as a distinct logical drive, and thus may deactivate only a half-platter or a full-platter as deemed appropriate (as opposed to deactivating the entire drive).

As described above, assuming that an example platter has a capacity of 2 TB, then each half-platter has a capacity of 1 TB. As such, by being configured to perform deactivation/abandonment of a half-platter (as opposed to abandonment of all platters of a drive upon which a failure occurred), certain embodiments may reduce the amount of data that needs to be rebuilt/replicated. Specifically, by being configured to be able to deactivate/abandon a single head and abandon a single side of a platter, while not abandoning the other platters of the drive, then certain embodiments only need to replicate/rebuild one terabyte of information onto a new platter.

With certain embodiments, the platters of a single drive may have a shared infrastructure such as, for example, a plurality of motors that operate in conjunction with each other, a plurality of actuators that operate in conjunction with each other, and a shared encasing. However, although the platters of the drive may have a shared infrastructure, each platter or each half-platter can be viewed as its own volume of memory, as a distinct logical drive.

In view of the above, certain embodiments may provide an unobvious advantage of improving reliability of a drive. For example, one possible problem with a drive is the problem of head instability. Head instability typically occurs when a head of a drive experiences an electronic problem such that the head cannot read information from a corresponding half-platter. With certain embodiments of the present invention, the problematic head can be singularly abandoned, and only data of a half platter is designated to be replaced.

There are currently efforts to configure each half-platter with more than one actuator/head, in order to increase the data throughput that is read from each half-platter. Therefore, with certain embodiments, if a plurality of actuators/heads is configured for each half-platter, if a single actuator/head fails, then certain embodiments can singularly deactivate that single failed actuator/head, while not deactivating other heads of the same half-platter. In this scenario, if other heads can continue to read from the same half-platter, then the need to rebuild the data of the half-platter may possibly be avoided altogether.

Additionally, certain embodiments of the present invention may reduce the amount of memory capacity that is needed to be allocated as spare capacity. For example, because certain embodiments can rebuild memory in increments of half-platters or single platters (as opposed to rebuilding memory in increments of entire drives), certain embodiments can allow users to allocate spare memory in increments of half-platters or single platters (as opposed to in increments of entire drives). As such, a spare drive with 5 spare platters can act as a spare for five problematic drives (where each problematic drive has a single platter to be restored/rebuilt).

In view of the above, certain embodiments may exhibit improved performance and improved reliability. Therefore, certain embodiments of the present invention may possibly allow hard drives and/or spindle drives to be a plausible alternative to using solid-state memory (i.e., NAND memory). Further, certain embodiments may allow hard drives and/or spindle drives to exhibit superior characteristics over solid state memory, because solid-state memory generally consumes a higher amount of power to operate.

Certain embodiments are directed to a computer program product that is embodied upon a non-transitory readable medium, which can be implemented within a server, a hard drive, and/or any other memory device. The computer program product can be firmware, for example.

With certain embodiments, once the memory device is connected within a computing system, the firmware will recognize each platter or half-platter as its logical drive. The firmware will report each platter or half-platter as its logical drive. Further, if a problem occurs within a platter or a half-platter, the firmware can configure the platter or half-platter to be singularly deactivated, as described above.

FIG. 1 illustrates a flowchart of a method in accordance with certain embodiments of the invention. The method illustrated in FIG. 1 includes, at 110, determining a failure of a drive. The drive comprises a plurality of platters, each platter comprises two half-platters, and data of the drive is stored via erasure encoding. The method also includes, at 120, rebuilding a portion of the drive upon which the failure occurred. Other portions of the drive are not rebuilt.

Figure 2:
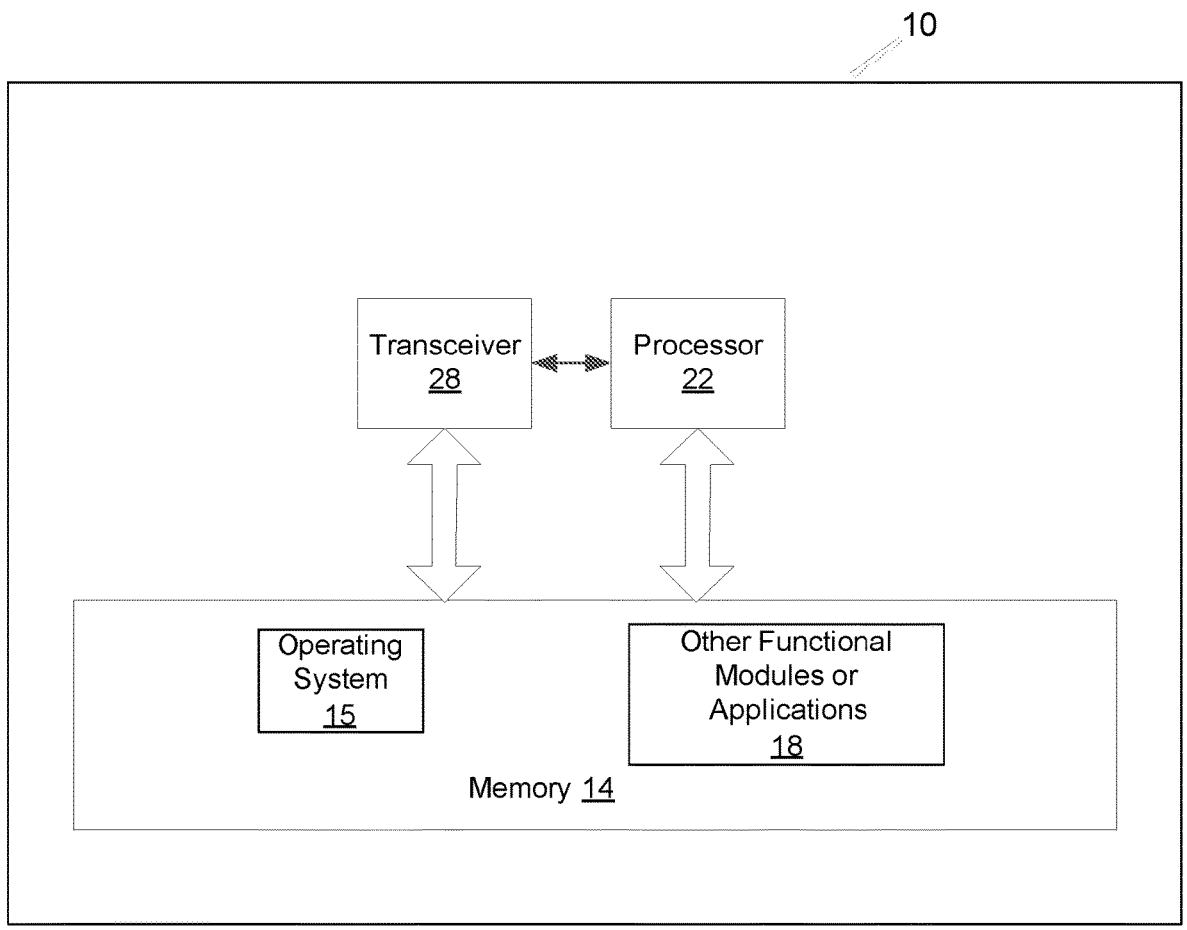
FIG. 2 illustrates an apparatus 10 according to certain embodiments of the present invention.

FIG. 2 illustrates an apparatus 10 according to certain embodiments of the present invention. It should be understood that each signal or block in FIG. 1 and the various functions described herein may be implemented by various means or their combinations, such as hardware, software, firmware, or one or more processors and/or circuitry. In an embodiment, apparatus 10 may be a component of a server or a hard drive device.

Apparatus 10 includes a processor 22 for processing information and executing instructions or operations. Processor 22 may be any type of general or specific purpose processor. While a single processor 22 is shown in FIG. 2, multiple processors may be utilized according to other embodiments. In fact, processor 22 may include one or more of general-purpose computers, special purpose computers, microprocessors, digital signal processors ("DSPs"), field-programmable gate arrays ("FPGAs"), application-specific integrated circuits ("ASICs"), and processors based on a multi-core processor architecture, as examples.

Apparatus 10 further includes a memory 14, coupled to processor 22, for storing information and instructions that may be executed by processor 22. Memory 14 may be one or more memories and of any type suitable to the local application environment, and may be implemented using any suitable volatile or nonvolatile data storage technology such as a semiconductor-based memory device, a magnetic memory device and system, an optical memory device and system, fixed memory, and removable memory. For example, memory 14 can be comprised of any combination of random access memory ("RAM"), read only memory ("ROM"), static storage such as a magnetic or optical disk, or any other type of non-transitory machine or computer readable media. The instructions stored in memory 14 may include program instructions or computer program code that, when executed by processor 22, enable the apparatus 10 to perform tasks as described herein.

Apparatus 10 may also include one or more antennas (not shown) for transmitting and receiving signals and/or data to and from apparatus 10. Apparatus 10 may further include a transceiver 28 that modulates information on to a carrier waveform for transmission by the antenna(s) and demodulates information received via the antenna(s) for further processing by other elements of apparatus 10. In other embodiments, transceiver 28 may be capable of transmitting and receiving signals or data directly.

Processor 22 may perform functions associated with the operation of apparatus 10 including, without limitation, precoding of antenna gain/phase parameters, encoding and decoding of individual bits forming a communication message, formatting of information, and overall control of the apparatus 10, including processes related to management of communication resources.

In an embodiment, memory 14 stores software modules that provide functionality when executed by processor 22. The modules may include an operating system 15 that provides operating system functionality for apparatus 10. The memory may also store one or more functional modules 18, such as an application or program, to provide additional functionality for apparatus 10. The components of apparatus 10 may be implemented in hardware, or as any suitable combination of hardware and software.

In one embodiment, apparatus 10 may be configured to determine a failure of a drive. The drive comprises a plurality of platters, each platter comprises two half-platters, and data of the drive is stored via erasure encoding. Apparatus 10 may also be configured to rebuild a portion of the drive upon which the failure occurred. Other portions of the drive are not rebuilt.

Figure 3:
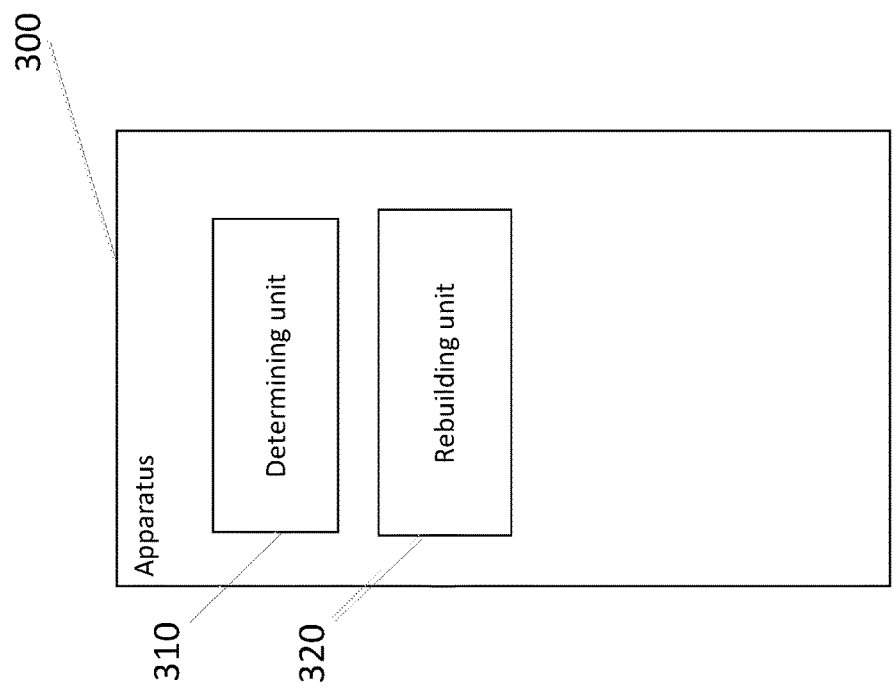
FIG. 3 illustrates another apparatus in accordance with certain embodiments of the invention.

FIG. 3 illustrates another apparatus in accordance with certain embodiments of the invention. Apparatus 300 can be a component of a server or a component of a hard drive device, for example. Apparatus 300 can include a determining unit 310 that determines a failure of a drive. The drive comprises a plurality of platters, each platter comprises two half-platters, and data of the drive is stored via erasure encoding. Apparatus 300 can also include a rebuilding unit 320 that rebuilds a portion of the drive upon which the failure occurred, wherein other portions of the drive are not rebuilt.

The described features, advantages, and characteristics of the invention can be combined in any suitable manner in one or more embodiments. One skilled in the relevant art will recognize that the invention can be practiced without one or more of the specific features or advantages of a particular embodiment. In other instances, additional features and advantages can be recognized in certain embodiments that may not be present in all embodiments of the invention. One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention.

I claim:

1. A method, comprising:
   determining a failure of a drive;
   deactivating a single head that corresponds to the portion of the drive upon which the problem occurred; and
   rebuilding a portion of the drive upon which the failure occurred,
   wherein the drive comprises a plurality of platters,
   wherein each platter of the plurality of platters comprises two half-platters,
   wherein data of the drive is stored via erasure encoding, and
   wherein each of the half-platters of the drive is separately addressable.

2. The method of claim 1, wherein other portions of the drive upon which the failure did not occur are not rebuilt.

3. The method of claim 1, wherein rebuilding the portion of the drive comprises rebuilding a single platter of the drive.

4. The method of claim 1, wherein rebuilding the portion of the drive comprises rebuilding the portion on a single new platter or a single new half-platter.

5. An apparatus, comprising:
   at least one processor; and
   at least one memory including computer program code, wherein the at least one memory and the computer program code are configured to, with the at least one processor, cause the apparatus at least to:

determine a failure of a drive;

deactivate a single head that corresponds to the portion of the drive upon which the problem occurred; and rebuild a portion of the drive upon which the failure occurred, wherein the drive comprises a plurality of platters, wherein each platter of the plurality of platters comprises two half-platters, wherein data of the drive is stored via erasure encoding, and wherein each of the half-platters of the drive is separately addressable.

6. The apparatus of claim 5, wherein other portions of the drive upon which the failure did not occur are not rebuilt.

7. The apparatus of claim 5, wherein rebuilding the portion of the drive comprises rebuilding a single platter of the drive.

8. The apparatus of claim 5, wherein rebuilding the portion of the drive comprises rebuilding the portion on a single new platter or a single new half-platter.

9. A computer program, embodied on a non-transitory computer readable medium, the computer program, when executed by a processor, causes the processor to:

determine a failure of a drive;

deactivate a single head that corresponds to the portion of the drive upon which the problem occurred; and rebuild a portion of the drive upon which the failure occurred, wherein the drive comprises a plurality of platters, wherein each platter of the plurality of platters comprises two half-platters, wherein data of the drive is stored via erasure encoding, and wherein each of the half-platters of the drive is separately addressable.

10. The computer program of claim 9, wherein other portions of the drive upon which the failure did not occur are not rebuilt.

11. The computer program of claim 9, wherein rebuilding the portion of the drive comprises rebuilding a single platter of the drive.

12. The computer program of claim 9, wherein rebuilding the portion of the drive comprises rebuilding the portion on a single new platter or a single new half-platter.

* * * * *